United States Patent
Choi et al.

(10) Patent No.: US 10,229,961 B2
(45) Date of Patent: Mar. 12, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Dong Wan Choi, Seoul (KR); Young Bin Kim, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/459,739

(22) Filed: Mar. 15, 2017

(65) Prior Publication Data

US 2018/0019293 A1    Jan. 18, 2018

(30) Foreign Application Priority Data

Jul. 14, 2016 (KR) .......................... 10-2016-0089369

(51) Int. Cl.
| | |
|---|---|
| *H01L 27/32* | (2006.01) |
| *H01L 51/52* | (2006.01) |
| *H01L 51/00* | (2006.01) |
| *G09G 3/3225* | (2016.01) |
| *G09G 3/3266* | (2016.01) |
| *G09G 3/3275* | (2016.01) |

(52) U.S. Cl.
CPC ...... *H01L 27/3272* (2013.01); *H01L 27/3248* (2013.01); *H01L 27/3262* (2013.01); *H01L 27/3276* (2013.01); *H01L 51/0097* (2013.01); *H01L 51/5284* (2013.01); *G09G 3/3225* (2013.01); *G09G 3/3266* (2013.01); *G09G 3/3275* (2013.01); *G09G 2300/0426* (2013.01); *G09G 2380/02* (2013.01); *H01L 27/3244* (2013.01); *H01L 2227/323* (2013.01); *H01L 2251/5315* (2013.01)

(58) Field of Classification Search
CPC ................................................... H01L 27/3272
USPC .......................................................... 257/43
See application file for complete search history.

(56) References Cited

U.S. PATENT DOCUMENTS

| | | | |
|---|---|---|---|
| 7,202,504 B2 * | 4/2007 | Ikeda ................. | H01L 27/3272 257/79 |
| 2002/0050958 A1 | 5/2002 | Matthies et al. | |
| 2015/0232067 A1 | 8/2015 | Schall | |

(Continued)

FOREIGN PATENT DOCUMENTS

| | | | |
|---|---|---|---|
| JP | 2000-302487 A | 10/2000 | |
| JP | 2003-203760 A | 7/2003 | |

(Continued)

OTHER PUBLICATIONS

European Search Report corresponding to EP Application No. 17181132.6, dated Nov. 16, 2017, 10 pages.

*Primary Examiner* — Chandra Chaudhari

(74) *Attorney, Agent, or Firm* — Innovation Counsel LLP

(57) ABSTRACT

A display device according to an exemplary embodiment of the present inventive concept includes: a substrate; a thin film transistor provided on a first side of the substrate; a first electrode connected with the thin film transistor; an organic emission layer provided on the first electrode and emitting light; a second electrode provided on the organic emission layer; and a light blocking layer contacting the substrate from a second side that faces the first side of the substrate, wherein the light is emitted in a direction toward the second electrode from the organic emission layer.

13 Claims, 12 Drawing Sheets

(56) References Cited

U.S. PATENT DOCUMENTS

2016/0093685 A1    3/2016   Kwon et al.
2016/0136927 A1    5/2016   Shin et al.
2016/0161770 A1*   6/2016   Joo ...................... G02F 1/0102
                                                            359/241

FOREIGN PATENT DOCUMENTS

JP      2012-015023 A      1/2012
KR      10-2015-0101260 A  9/2015

* cited by examiner

B                A

C                A

D  A

E  A

DISPLAY DEVICE AND MANUFACTURING METHOD THEREOF

CROSS-REFERENCE TO RELATED APPLICATION

This application claims priority to and the benefit of Korean Patent Application No. 10-2016-0089369 filed in the Korean Intellectual Property Office on Jul. 14, 2016, the entire contents of which are incorporated herein by reference.

BACKGROUND (a) Field

The present inventive concept relates to a display device and a method for manufacturing the same.

(b) Description of the Related Art

A display device includes an organic light emitting element, and the organic light emitting element includes two electrodes and an emission layer provided between the two electrodes, wherein electrons injected from one of the two electrodes and holes injected from the other electrode are combined inside the emission layer to form excitons and the excitons emit light while discharging energy.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a display device that can reduce visibility of the inside of a display panel due to reflection or transmission of external light, and a method for manufacturing the same.

A display device according to an exemplary embodiment of the present inventive concept includes: a substrate; a thin film transistor provided on a first side of the substrate; a first electrode connected with the thin film transistor; an organic emission layer provided on the first electrode and emitting light; a second electrode provided on the organic emission layer; and a light blocking layer contacting the substrate from a second side that faces the first side of the substrate, wherein the light is emitted in a direction toward the second electrode from the organic emission layer.

The light blocking layer may include carbon black.

The carbon black may be included with a content of about 3 wt % to about 10 wt % with respect to the total content of a material that forms the light blocking layer.

An average diameter of carbon black particles may be about 320 nm to about 470 nm.

The first electrode may be made of a reflective material and the second electrode is made of a transparent material.

The substrate may include: a display area where a plurality of pixels are arranged in a matrix format; and a peripheral area that surrounds the display area, wherein the light blocking layer overlaps the entire display area.

The light blocking layer may partially overlap the peripheral area, while not overlapping an edge of the peripheral area.

A cross-section of the edge of the light blocking layer may have a curved line shape.

The display device may further include a cover panel that overlaps the substrate, wherein the light blocking layer is provided between the cover panel and the substrate.

The cover panel may include: an impact buffer layer that overlaps the light blocking layer; and an adhesive layer provided between the impact buffer layer and the light blocking layer.

The adhesive layer may overlap the substrate, and may contact at least one of the light blocking layer and the substrate.

The adhesive layer may directly contact a part of the substrate.

The cover panel may further include at least one of an auxiliary layer, a support layer, and an Embo-type adhesive layer, which are provided between the adhesive layer and the light blocking layer.

The display device may further include an encapsulation substrate that is provided on the second electrode and is made of a transparent material.

The display device may be flexible.

According to another exemplary embodiment of the present inventive concept, a method for manufacturing a display device is provided. The method includes: preparing a display panel that includes a thin film transistor that is provided on a first side of a substrate and an organic light emitting element connected with the thin film transistor; and forming a light blocking layer that contacts a second side that faces the first side of the substrate, wherein the organic light emitting element includes: a first electrode connected with the thin film transistor; an organic emission layer provided on the first electrode; and a second electrode provided on the organic emission layer, and the display panel emits light in a direction toward the second electrode from the organic emission layer.

The forming of the light blocking layer may be performed using one of a print method, a deposition method, and a spray method.

The forming of the light blocking layer may include curing a light blocking material after coating the light blocking material.

In the curing of the light blocking material, a cross-section of an edge of the light blocking may be cured to be inclined with respect to a direction that is perpendicular to a flat surface of the substrate.

The light blocking layer may be formed in the second side after forming the thin film transistor and the organic light emitting element in the first side.

The method may include, after forming the light blocking layer in the second side, forming the thin film transistor and the organic light emitting element in the first side.

The light blocking material may be a gel-type material.

According to the exemplary embodiments, although the display panel has a thin thickness and is made of a high-transmissive material, the light blocking layer can effectively absorb external light so that visibility of the inside of the display panel due to external light can be reduced.

Further, the thickness of the cover panel can be reduced, and therefore the thickness and the weight of the display device can be reduced.

DETAILED DESCRIPTION OF THE EMBODIMENTS

Figure 1:
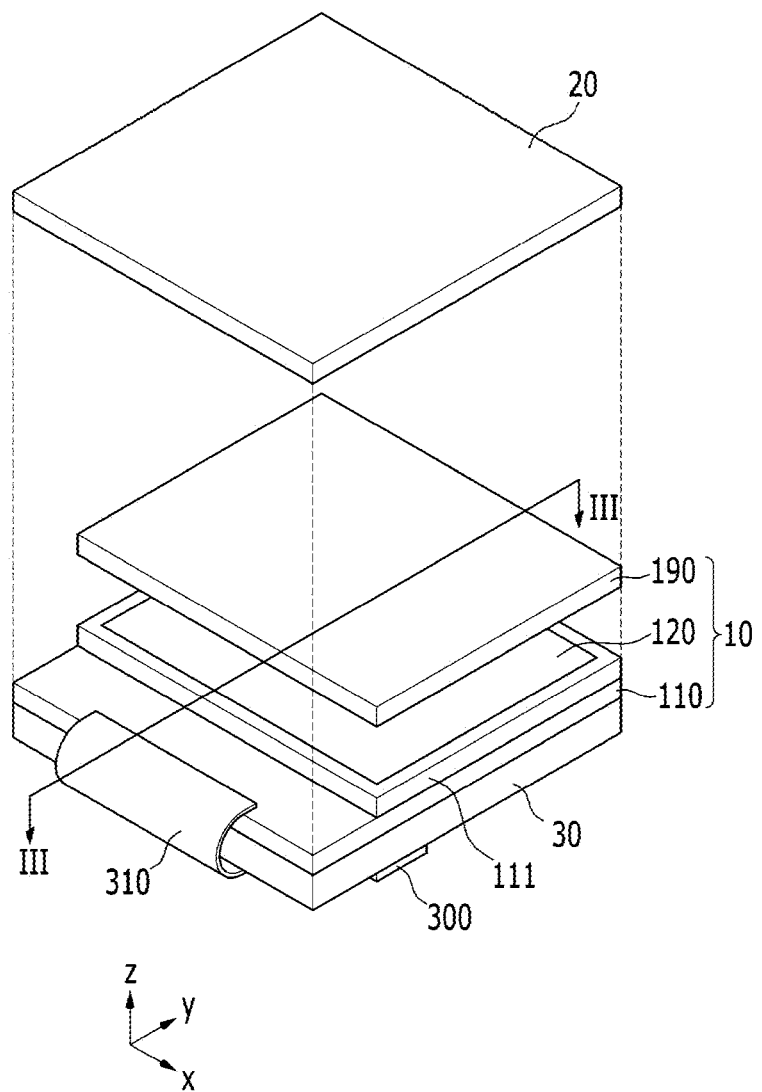
FIG. 1 is an exploded perspective view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

Parts not associated with description are omitted for clearly describing the exemplary embodiments of the present inventive concept, and like reference numerals designate like elements throughout the specification.

Since sizes and thicknesses of each component illustrated in the drawings are arbitrarily represented for convenience of explanation, the present inventive concept is not particularly limited to the illustrated sizes and thicknesses of each component. In the drawings, the thickness of layers, films, panels, regions, etc., are exaggerated for clarity. In addition, in the drawings, the sizes and thicknesses are enlarged in order to clearly express various parts and areas.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements. Further, in this specification, the phrase "on a plane" means viewing a target portion from the top, and the phrase "on a cross-section" means viewing a cross-section formed by vertically cutting a target portion from the side.

Figure 2:
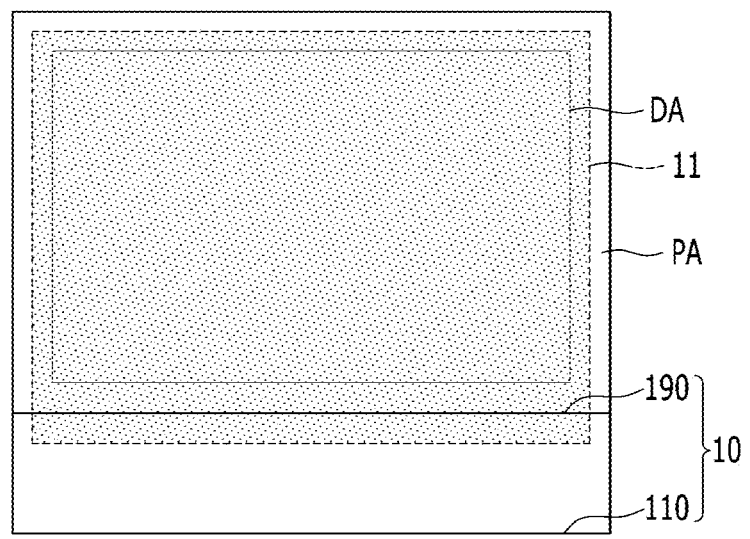
FIG. 2 is a top plan view of a substrate, an encapsulation substrate, and a light blocking layer according to the exemplary embodiment of the present inventive concept.
Figure 3:
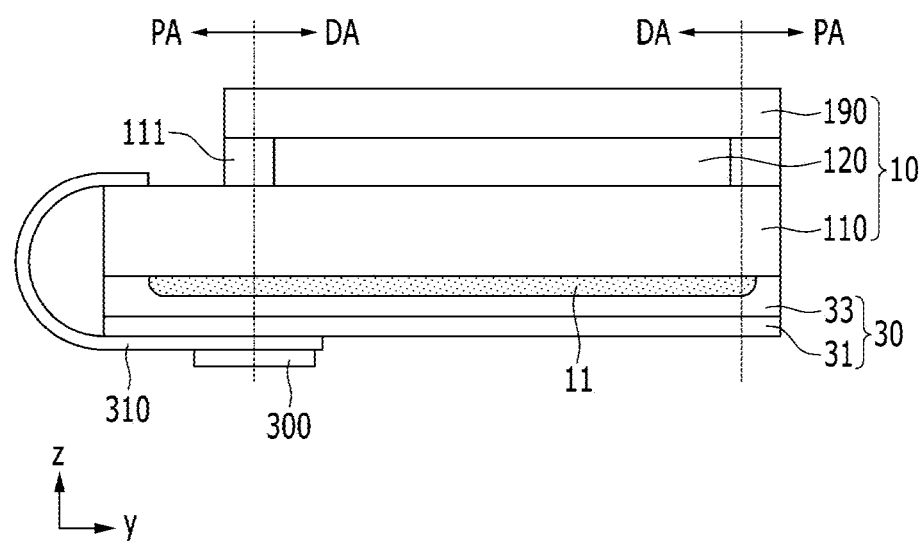
FIG. 3 is a cross-sectional view of FIG. 1, taken along the line III-III.

First, a display device according to an exemplary embodiment of the present inventive concept will be described with reference to FIG. 1 to FIG. 3. FIG. 1 is an exploded perspective view of a display device according to an exemplary embodiment of the present inventive concept, FIG. 2 is a top plan view of a substrate, an encapsulation substrate, and a light blocking layer according to the exemplary embodiment of the present inventive concept, and FIG. 3 is a cross-sectional view of FIG. 1, taken along the line III-III.

A display device according to the exemplary embodiment of the present inventive concept includes a display panel 10 that displays an image, a window 20 provided at an outer side of a display side of the display panel 10, and a cover panel 30 provided at a rear side of the display panel 10 facing the display side.

In addition, although it is not illustrated, the display device according to the present exemplary embodiment may further include a touch screen panel provided on the display side of the display panel 10, a touch screen circuit film connected with the touch screen panel, and a resin layer provided between the touch screen panel and the window 20. The display device according to the exemplary embodiment of the present inventive concept may be a flat panel display device or a flexible display device.

The display panel 10 includes a substrate 110 that includes a display area DA and a peripheral area PA that surrounds the display area DA, a display portion 120 that includes a plurality of pixels arranged in a matrix format on the substrate 110, and an encapsulation substrate 190 provided on the display portion 120 and bonded with the substrate 110 by a sealant 111.

The display portion 120 is provided in the display area DA of the substrate 110, and the display portion 120 also includes a plurality of signal lines that include scan lines and data lines. A plurality of metal wires (not shown) that are connected with the plurality of signal lines are provided in the peripheral area PA.

The plurality of pixels arranged in a matrix format on one side of the substrate 110 emit light toward the encapsulation substrate 190, and an outer surface of the encapsulation substrate 190 becomes the display side of the display panel 10. That is, the pixels emit light toward a direction (i.e., +Z axis) that faces the encapsulation substrate 190 from the substrate 110.

One of the plurality of pixels included in the display portion 120 will be described in detail with reference to FIG. 7 and FIG. 8.

The display panel 10 includes a scan driver and a data driver. The scan driver supplies a scan signal to the plurality of pixels through the scan lines, and the data driver supplies a data signal to the plurality of pixels through the data lines. One of the scan driver and the data driver may be installed in the peripheral area PA using a chip on class (COG) method.

The encapsulation substrate 190 is smaller than the substrate 110, and overlaps the display area DA of the substrate 110. The substrate 110 and the encapsulation substrate 190 may be integrally bonded by the sealant 111 coated along the edge of the encapsulation substrate 190. The encapsulation substrate 190 encapsulates the plurality of pixels to protect the pixels from an external atmosphere that includes moisture and oxygen. Instead of the encapsulation substrate 190, a thin film encapsulation layer formed by alternately stacking at least one organic layer and at least one inorganic layer may be provided, and in this case, the sealant 111 can be omitted.

The display device according to the exemplary embodiment of the present inventive concept includes a printed circuit board 300 where a control circuit that transmits a control signal to the display panel is formed, and a main circuit film 310 that connects the display panel 10 and the printed circuit board 300.

The main circuit film 310 is attached to the peripheral area PA of the substrate 110 and is thus electrically connected with the metal wires (not shown), and is bent toward the side opposite to the display side of the display panel 10 such that the printed circuit board 300 is disposed on the side opposite to the display side of the display panel 10. However, this is not restrictive, and the printed circuit board 300 can be connected with the display panel 10 using various means and formats. In addition, the other one of the scan driver and the data driver may be installed on the main circuit film 310 using a chip on film (COF) method.

The window 20 is provided at an outer side of the display side of the display panel 10 to protect the display panel 10 from an external impact or a scratch. The window 20 is made of a transparent material such as glass or transparent plastic, and wholly covers the encapsulation substrate 190 and the peripheral area PA. The window 20 may include a transmission area that corresponds to the display area DA and a blocking area (or a pattern area) that surrounds the transmission area, and no image is displayed in the blocking area in the display area 10.

The display device according to the exemplary embodiment of the present inventive concept includes a light blocking layer 11 provided at a side that is disposed facing the display side of the display panel 10. The light blocking layer 11 is provided in the direction opposite (−Z) to the light emission direction (i.e., +Z axis of FIG. 1) of the display panel 10. Referring to FIG. 1, the window 20 may be provided on one side of the display panel 10, and the light blocking layer 11 may be provided on the other side of the display panel 10 that faces the one side. The light blocking layer 11 may be provided between the display panel 10 and a cover panel 30, and may contact the substrate 110.

There is no limit in a manufacturing order of the display device according to the exemplary embodiment of the present inventive concept, and thus the display portion 120 included in the display panel 10 may be formed first and then the light blocking layer 11 may be formed later or the light blocking layer 11 may be formed first and then the display portion 120 may be formed later.

The light blocking layer 11 absorbs and blocks external light from an outer side of the display side of the display panel 10 so that the inside of the display panel 10 can be prevented from being seen.

As shown in FIG. 2, the light blocking layer 11 may wholly overlap the display area DA. Further, the light blocking layer 11 may partially overlap the peripheral area PA, and the edge of the light blocking layer 11 is neither overlapped nor aligned with the edge of the peripheral area PA. That is, the peripheral area PA may include an area that does not overlap the light blocking layer 11. The area of the light blocking layer 11 that overlaps the peripheral area PA may be controlled according to a process margin. The light blocking layer 11 may completely cover the display area DA and the peripheral area PA except an area in which alignment marks are.

Depending on an exemplary embodiment of the present inventive concept, an alignment mark required during a manufacturing process can be exposed by the light blocking layer 11. The alignment mark is provided in the peripheral area PA of the substrate, and may be used to align between panels in a process of bonding panels (e.g., bonding between a display panel and a touch panel, bonding between a display panel and a window, and the like). When the light blocking layer 11 wholly covers the peripheral area PA, the alignment mark cannot be exposed, thereby causing difficulty in alignment between panels. However, since the light blocking layer 11 partially exposes the alignment mark in the peripheral area PA, the bonding panels are easily aligned using the alignment mark in the peripheral area PA. Accordingly, the alignment mark according to the exemplary embodiment of the present inventive concept is not covered by the light blocking layer 11 and thus can be used to alignment of bonding panels during a manufacturing process.

The light blocking layer 11 may be provided on one side of the substrate 110 without an additional bonding means. No separation space or empty space due to lifting is generated between the substrate 110 and the light blocking layer 11, and accordingly, the light blocking layer 11 can effectively absorb external light. However, the light blocking layer 11 is attached to the substrate 110 using an additional bonding means.

Specifically, the light blocking layer 11 can completely contact one side of the substrate 110 by coating and curing of the light blocking material to prevent a gap from being generated between the light blocking layer 11 and the substrate 110 such that the light blocking layer 11 can effectively absorb external light.

A process for coating the light blocking material may be performed using one of a spray process, a deposition process, and a print process, and the print process may exemplarily include a silkscreen process.

In addition, a process for curing the coated light blocking process may be performed using a thermal-curing process or a photo-curing process. When the light blocking material includes a thermal hardener, a thermal-curing process may be used, and when the light blocking material includes a photo-hardener, the photo-curing process may be used, but this is not restrictive.

A cross-section of the edge of the light blocking layer 11 in a direction that is perpendicular to the flat surface of the substrate 110 may be inclined and may have a curved line shape. That is, a side surface of the light blocking layer 11 may be inclined with respect to the flat surface of the substrate 110. According to the exemplary embodiment of the present inventive concept, the light blocking layer 11 may be formed through the curing process after coating a gel-type light blocking material on the substrate 110, and an edge of the coated light blocking material may be cured to be inclined with respect to the flat surface of the substrate 110 during the curing process.

The light blocking material that forms light blocking layer 11 may be any material that can form the light blocking material 11 through the above-stated process while absorbing external light, and for example, the light blocking material may include carbon black, which is a black pigment that contains carbon.

The carbon black may be included with a content of about 3 wt % to 10 wt % with respect to the total content of the light blocking material. When the content of the carbon black is less than about 3 wt %, transmittance of the external light that passes through the display panel 10 and the light blocking layer 11 exceed 20%, and thus the inside can be seen and the external light cannot be absorbed or blocked effectively, and when the content of the carbon black is about 10 wt %, transmittance of the external light almost reaches zero so that about 99% of the external light can be blocked, thereby providing a sufficient external light blocking effect.

The light blocking material may further include a hardener, a resin, and additives other than the carbon black depending on a process condition.

In addition, an average diameter of carbon black particles may be about 320 nm to about 470 nm. When the average diameter of the carbon black particles is less than 320 nm, the carbon black particles are agglomerated with each other because they are too small to be mixed with other materials (e.g., a hardener, a resin, and the like), and when the average diameter of the carbon black particles exceeds 470 nm, a space between the carbon black particles is increased, thereby deteriorating the light blocking effect.

In addition, transmittance of the external light that passes through the display panel 10 when no voltage is applied and the light blocking layer 11 may be less than about 20% with reference to incident external light. The light blocking layer 11 having such a transmittance range can sufficiently absorb and block external light, and accordingly, the inside of the display panel 10 can be prevented from being seen. That is, when the external light transmittance exceeds 20%, external light cannot be effectively absorbed or blocked, and the inside of the display panel 10 cannot be prevented from being seen within such a range.

The display device according to the exemplary embodiment of the present inventive concept further includes the cover panel 30 that overlaps the display panel 10 while facing the same. The light blocking layer 11 is disposed between the cover panel 30 and the display panel 10. The cover panel 30 according to the exemplary embodiment of the present inventive concept includes an impact buffer layer 31 and an adhesive layer 33.

The impact buffer layer 31 protects the display device by absorbing an external force or impact applied to the display device. The impact buffer layer 31 can be made of any material for absorbing an external force and the like, and for example, the material may be a sponge having low elasticity.

The impact buffer layer 31 may wholly overlap the substrate 110 so as to protect the entire display panel 10.

The adhesive layer 33 is disposed between the impact buffer layer 31 and the light blocking layer 11, and attaches the impact buffer layer 31 to the light blocking layer 11 and the display panel 10.

The adhesive layer 33 may be changed in shape depending on an exemplary embodiment of the present inventive concept, and may be disposed between the substrate 110 and the entire impact buffer layer 31. As shown in FIG. 3, the substrate 110 includes the peripheral area PA that does not overlap the light blocking layer 11, and therefore the substrate 110 and the adhesive layer 33 may directly contact each other.

In the present exemplary embodiment, the adhesive layer 33 is formed with a thicker thickness in the peripheral area PA, but this is not restrictive. The adhesive layer 33 may be formed with a constant thickness with respect to the entire surface of the substrate 110.

The above-described display device includes the light blocking layer 11 that contacts the bottom of the display panel 10 in which thin film transistors are not arranged, and the light blocking layer 11 absorbs external light incident from the outer side of the display side of the display panel 10 to suppress the inside of the display panel 10 from being seen due to reflection of external light, and accordingly, quality of the display device can be improved.

In addition, the cover panel 30 included in the display device includes a thin impact buffer layer 31 and adhesive layer 33, and therefore a thickness and a weight of the display device can be reduced and a manufacturing process can be simplified.

Figure 4:
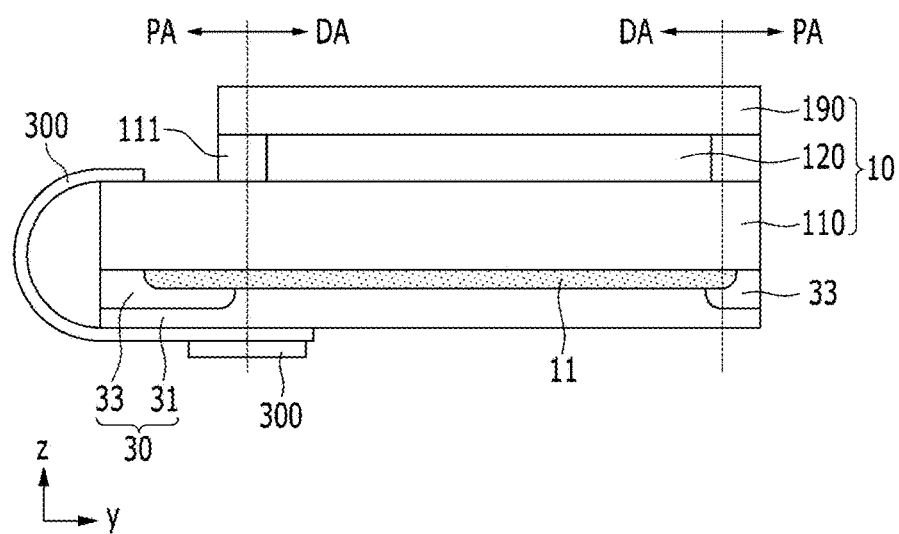
FIG. 4, FIG. 5, and FIG. 6 are cross-sectional views of exemplary variations of FIG. 3.
Figure 5:
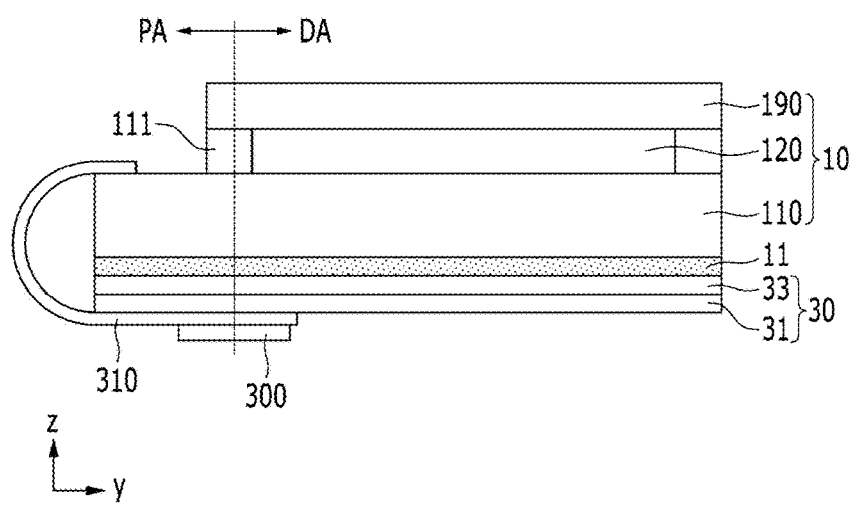
Figure 6:
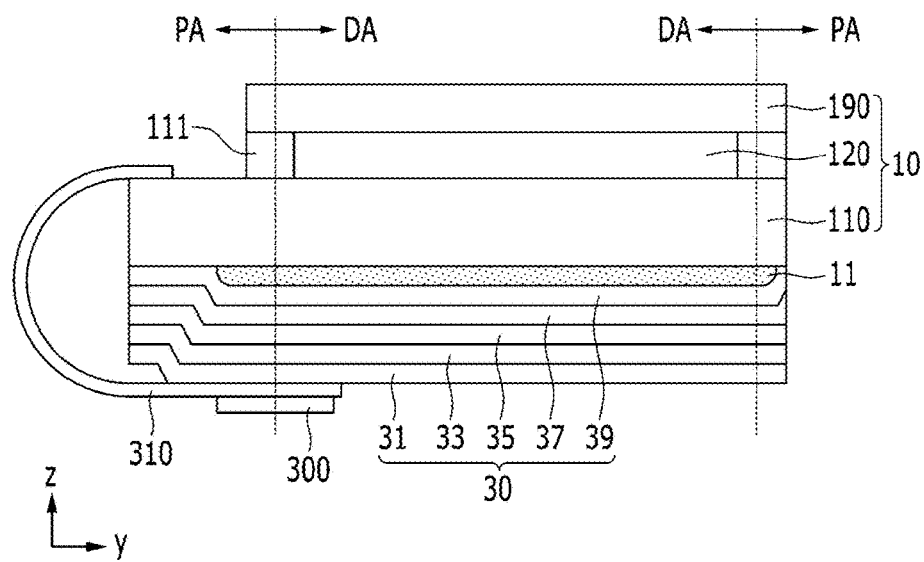

Hereinafter, a display device according to an exemplary variation of FIG. 3 will be described with reference to FIG. 4 to FIG. 6. FIG. 4, FIG. 5, and FIG. 6 are cross-sectional views according to exemplary variations of FIG. 3, and constituent elements that are the same as those described above will not be further described.

Referring to FIG. 4, a display device according to an exemplary embodiment includes a display panel 10, a cover panel 30, and a light blocking layer 11 provided between the display panel 10 and the cover panel 30. In addition, the display device according to the present exemplary embodiment includes a printed circuit board 300 where a control circuit that transmits a control signal to the display panel 10 is formed and a main circuit film 310 that connects the display panel and the printed circuit board 300.

The display panel 10 includes a substrate 110 that includes a display area DA and a peripheral area PA that surrounds the display area DA, a display portion 120 that includes a plurality of pixels arranged in a matrix formed on the substrate 110, and an encapsulation substrate 190 provided on the display portion 120 and bonded with the substrate 110 by a sealant 111.

The plurality of pixels included in the display portion 120 emit light toward the encapsulation substrate 190.

The display device according to the present exemplary embodiment includes a light blocking layer 11 that contacts a second side facing a display side of the display panel 10, that is, the second side that faces a first side of the substrate 110 where thin film transistors are arranged. The light blocking layer 11 is disposed in the opposite direction (−Z direction) with reference to a direction (+Z direction) to which the display panel 10 emits light. The light blocking layer 11 may be provided between the display panel 10 and a cover panel 30, and may directly contact the substrate 110 and the cover panel 30.

The light blocking layer 11 reflects external light incident from an outer side of the display side of the display panel 10 by absorbing the external light so that the inside of the display panel 10 can be prevented from being seen.

As shown in FIG. 4, the light blocking layer 11 may wholly overlap the display area DA. In addition, the light blocking layer 11 may partially overlap the peripheral area PA, and an edge of the light blocking layer 11 may neither be overlapped with nor aligned with an outer edge of the peripheral area PA. That is, the peripheral area PA may include a portion that does not overlap the light blocking layer 11.

The light blocking layer 11 may be provided on one side of the substrate 110 without an additional bonding means. No separated space or empty space due to lifting) is generated between the substrate 110 and the light blocking layer 11, and accordingly, the light blocking layer 11 can effectively absorb external light. When the light blocking layer 11 is attached to the substrate 110 using an additional bonding means, a gap between the light blocking layer 11 and the substrate 110 may be generated, thereby causing deterioration of efficiency of external light blocking and external light absorption.

Specifically, the light blocking layer 11 can completely contact one side of the substrate 110 through coating and curing of the light blocking material to prevent a gap from being generated between the light blocking layer 11 and the substrate 110 such that the light blocking layer 11 can effectively absorb external light.

A process for coating the light blocking material may be performed using one of a spray process, a deposition process, and a print process, and the print process may exemplarily include a silkscreen process.

In addition, a process for curing the coated light blocking process may be performed using a thermal-curing process or a photo-curing process. When the light blocking material includes a thermal hardener, the thermal-curing process may be used, and when the light blocking material includes a photo-hardener, the photo-curing process may be used, but this is not restrictive.

A cross-section of the edge of the light blocking layer 11 in a direction that is perpendicular to the flat surface of the substrate 110 may be inclined and may have a curved line shape. That is, a side surface of the light blocking layer 11 may be inclined with respect to the flat surface of the substrate 110. Specifically, a gel-type light blocking material is coated on the substrate 110 and then cured such that the light blocking layer 11 is formed, and an edge of the coated light blocking material may be cured to be inclined with respect to the substrate 110 during the curing process.

The light blocking material that forms the light blocking layer 11 may be any material that can form the light blocking material 11 through the above-stated process while absorbing external light, and for example, the light blocking material may include carbon black, which is a black pigment that contains carbon.

The carbon black may be included with a content of about 3 wt % to 10 wt % with respect to the total content of the light blocking material. When the content of the carbon black is less than about 3 wt %, transmittance of the external light that passes through the display panel 10 and the light blocking layer 11 exceed 20%, and thus the inside can be seen and the external light cannot be absorbed or blocked effectively, and when the content of the carbon black is about 10 wt %, transmittance of the external light almost reaches zero so that about 99% of the external light can be blocked, thereby providing a sufficient external light blocking effect.

The light blocking material may further include a hardener, a resin, and additives other than the carbon black depending on a process condition.

In addition, an average diameter of the carbon black particles may be about 320 nm to about 470 nm. When the average diameter of the carbon black particles is less than 320 nm, the carbon black particles are agglomerated with each other because they are too small to be mixed with other materials (e.g., a hardener, a resin, and the like), and when the average diameter of the carbon black particles exceeds 470 nm, a space between the carbon black particles is increased, thereby deteriorating the light blocking effect.

In addition, transmittance of the external light that passes through the display panel 10 when no voltage is applied and the light blocking layer 11 may be less than about 20% with reference to incident external light. The light blocking layer 11 having such a transmittance range can sufficiently absorb and block external light, and accordingly, the inside of the display panel 10 can be prevented from being seen. That is, when the external light transmittance exceeds 20%, external light cannot be effectively absorbed or blocked, and the inside of the display panel 10 cannot be prevented from being seen within such a range.

The display device according to the present exemplary embodiment further includes a cover panel 30 that overlaps the display panel 10 while facing the same. The light blocking layer 11 is disposed between the cover panel 30 and the display panel 10. The cover panel 30 according to the exemplary embodiment of the present inventive concept includes an impact buffer layer 31 and an adhesive layer 33.

The impact buffer layer 31 protects the display device by absorbing an external force or impact applied to the display device. The impact buffer layer 31 can be made of any material for absorbing an external force and the like, and for example, the material may be a sponge having low elasticity.

The impact buffer layer 31 may wholly overlap the substrate 110 so as to protect the entire display panel 10. In addition, the impact buffer layer 31 according to the present exemplary embodiment includes areas having different thicknesses, but this is not restrictive. The impact buffer layer 31 may have a constant thickness with respect to the entire surface of the impact buffer layer 31. The adhesive layer 33 is disposed between the impact buffer layer 31 and the light blocking layer 11, and attaches the impact buffer layer 31 to the light blocking layer 11 and the display panel 10.

The adhesive layer 33 may be changed in shape depending on an exemplary embodiment of the present inventive concept, and may partially overlap the impact buffer layer 31 in the exemplary embodiment. As shown in FIG. 4, the adhesive layer 33 may not be disposed over the entire substrate 110 but may be disposed at any portion of the substrate 110 as long as the impact buffer layer 31 can be attached to the light blocking layer 11 and the display panel 10. For example, the adhesive layer 33 may overlap the peripheral area PA of the substrate 110 in which the light blocking layer 11 is not disposed. In this case, the substrate 110 and the adhesive layer 33 may directly contact each other, and the adhesive layer 33 may partially overlap the light blocking layer 11 and a portion of the adhesive layer 33 that overlaps the light blocking layer 11 does not directly contacting the substrate 110. According to the present exemplary embodiment, the adhesive layer 33 that attaches the cover panel 30 to the display panel 10 may be changed in shape and location depending on an exemplary embodiment of the present inventive concept.

Referring to FIG. 5, a display device according to an exemplary embodiment includes a display panel 10, a cover panel 30, and a light blocking layer 11 provided between the display panel 10 and the cover panel 30. In addition, the display device according to the present exemplary embodiment includes a printed circuit board 300 where a control circuit that transmits a control signal to the display panel 10 is formed, and a main circuit film 310 that connects the display panel and the printed circuit board 300.

The display panel 10 includes a substrate 110 that includes a display area DA and a peripheral area PA that surrounds the display area DA, a display portion 120 that includes a plurality of pixels arranged in a matrix format on the substrate 110, and an encapsulation substrate 190 provided on the display portion 120 and bonded with the substrate 110 by a sealant 111.

The plurality of pixels included in the display portion 120 emit light toward the encapsulation substrate 190.

The display device according to the present exemplary embodiment includes a light blocking layer 11 that contacts a second side facing a display side of the display panel 10, that is, the second side that faces a first side of the substrate 110 where thin film transistors are arranged. The light blocking layer 11 is disposed in the opposite direction (−Z direction) with reference to a direction (+Z direction) to which the display panel 10 emits light. The light blocking layer 11 may be provided between the display panel 10 and a cover panel 30, and may directly contact the substrate 110 and the cover panel 30.

As shown in FIG. 5, the light blocking layer 11 may overlap not only the entire display area DA but also the entire peripheral area PA. The light blocking layer 11 may overlap the entire substrate 110. The light blocking layer 11 may have a portion which exposes an alignment marks formed on the substrate 110. During a process for forming the light blocking layer 11, the light blocking material may overflow to the outside of the peripheral area PA, and in this case, a cleansing process may be added to remove the overflown light blocking material at the outside of the peripheral area PA.

The light blocking layer 11 may be provided on one side of the substrate 110 without an additional bonding means. No separated space or empty space due to lifting is generated between the substrate 110 and the light blocking layer 11, and accordingly, the light blocking layer 11 can effectively absorb external light.

Specifically, the light blocking layer 11 can completely contact one side of the substrate 110 through coating and curing of the light blocking material to prevent a gap from being generated between the light blocking layer 11 and the substrate 110 such that the light blocking layer 11 can effectively absorb external light.

A process for coating the light blocking material may be performed using one of a spray process, a deposition process, and a print process, and the print process may exemplarily include a silkscreen process.

In addition, a process for curing the coated light blocking process may be performed using a thermal-curing process or a photo-curing process. When the light blocking material includes a thermal hardener, the thermal-curing process may be used, and when the light blocking material includes a photo-hardener, the photo-curing process may be used, and this is not restrictive.

The light blocking material that forms the light blocking layer 11 may be any material that can form the light blocking material 11 through the above-stated process while absorbing external light, and for example, the light blocking material may include carbon black, which is a black pigment that contains carbon.

The carbon black may be included with a content of about 3 wt % to 10 wt % with respect to the total content of the light blocking material. When the content of the carbon black is less than about 3 wt %, transmittance of the external light that passes through the display panel 10 and the light blocking layer 11 exceed 20%, and thus the inside can be seen and the external light cannot be absorbed or blocked effectively, and when the content of the carbon black is about 10 wt %, transmittance of the external light almost reaches zero so that about 99% of the external light can be blocked, thereby providing a sufficient external light blocking effect.

The light blocking material may further include a hardener, a resin, and additives other than the carbon black depending on a process condition.

In addition, an average diameter of the carbon black particles may be about 320 nm to about 470 nm. When the average diameter of the carbon black particles is less than 320 nm, the carbon black particles are agglomerated with each other because they are too small to be mixed with other materials (e.g., a hardener, a resin, and the like), and when the average diameter of the carbon black particles exceeds 470 nm, a space between the carbon black particles is increased, thereby deteriorating the light blocking effect. In addition, transmittance of the external light that passes through the display panel 10 when no voltage is applied and the light blocking layer 11 may be less than about 20% with reference to incident external light. The light blocking layer 11 having such a transmittance range can sufficiently absorb and block external light, and accordingly, the inside of the display panel 10 can be prevented from being seen. That is, when the external light transmittance exceeds 20%, external light cannot be effectively absorbed or blocked, and the inside of the display panel 10 cannot be prevented from being seen within such a range.

The display device according to the present exemplary embodiment further includes a cover panel 30 that overlaps the display panel 10 while facing the same. The light blocking layer 11 is disposed between the cover panel 30 and the display panel 10. The cover panel 30 according to the exemplary embodiment of the present inventive concept includes an impact buffer layer 31 and an adhesive layer 33.

The impact buffer layer 31 protects the display device by absorbing an external force or impact applied to the display device. The impact buffer layer 31 can be made of any material for absorbing an external force and the like, and for example, the material may be a sponge having low elasticity.

The impact buffer layer 31 may wholly overlap the substrate 110 so as to protect the entire display panel 10.

The adhesive layer 33 is disposed between the impact buffer layer 31 and the light blocking layer 11, and attaches the impact buffer layer 31 to the light blocking layer 11.

In the present exemplary embodiment, the adhesive layer 33 overlaps the entire light blocking layer 11 and the entire impact buffer layer 31, but this is not restrictive. The adhesive layer 33 according to an exemplary embodiment of the present inventive concept may overlap the impact buffer layer 31 and a part of the light blocking layer 11. That is, the exemplary embodiment shown in FIG. 5 is not restrictive, and the adhesive layer 33 may be disposed at any portion of the substrate 110 as long as the impact buffer layer 31 can be attached to the light blocking layer 11. The adhesive layer 33 may be changed in shape and location depending on an exemplary embodiment of the present inventive concept.

Next, referring to FIG. 6, a display device according to an exemplary embodiment includes a display panel 10, a cover panel 30, and a light blocking layer 11 provided between the display panel 10 and the cover panel 30. Further, the display device according to the present exemplary embodiment includes a printed circuit board 300 where a control circuit that transmits a control signal to the display panel 10 is formed, and a main circuit film 310 that connects the display panel and the printed circuit board 300.

The display panel 10 includes a substrate 110 that includes a display area DA and a peripheral area PA that surrounds the display area DA, a display portion 120 that includes a plurality of pixels arranged in a matrix format on the substrate 110, and an encapsulation substrate 190 provided on the display portion 120 and bonded with the substrate 110 by a sealant 111.

The plurality of pixels included in the display portion 120 emit light toward the encapsulation substrate 190.

The display device according to the present exemplary embodiment includes a light blocking layer 11 that contacts a second side facing a display side of the display panel 10, that is, the second side that faces a first side of the substrate 110 where thin film transistors are arranged. The light blocking layer 11 is disposed in the opposite direction (−Z direction) with reference to a direction (+Z direction) to which the display panel 10 emits light. The light blocking layer 11 may be provided between the display panel 10 and a cover panel 30, and may directly contact the substrate 110 and the cover panel 30.

The light blocking layer 11 reflects external light incident from an outer side of the display side of the display panel 10 by absorbing the external light so that the inside of the display panel 10 can be prevented from being seen.

As shown in FIG. 6, the light blocking layer 11 may wholly overlap the display area DA. In addition, the light blocking layer 11 may partially overlap the peripheral area PA, and an edge of the light blocking layer 11 may neither be overlapped with nor aligned with an edge of the peripheral area PA. The peripheral area PA may include a portion that does not overlap the light blocking layer 11. The area of the light blocking layer 11 that overlaps the peripheral area PA may be controlled according to a process margin.

The light blocking layer 11 may be provided on one side of the substrate 110 without an additional bonding means. No separated space or empty space due to lifting) is generated between the substrate 110 and the light blocking layer 11, and accordingly, the light blocking layer 11 can effectively absorb external light. When the light blocking layer 11 is attached to the substrate 110 using an additional bonding means, a gap between the light blocking layer 11 and the substrate 110 may be generated, thereby causing deterioration of efficiency of external light blocking and external light absorption.

Specifically, the light blocking layer 11 can completely contact one side of the substrate 110 through coating and curing of the light blocking material to prevent a gap from being generated between the light blocking layer 11 and the substrate 110 such that the light blocking layer 11 can effectively absorb external light.

A process for coating the light blocking material may be performed using one of a spray process, a deposition process, and a print process, and the print process may exemplarily include a silkscreen process.

In addition, a process for curing the coated light blocking process may be performed using a thermal-curing process or a photo-curing process. When the light blocking material includes a thermal hardener, the thermal-curing process may be used, and when the light blocking material includes a photo-hardener, the photo-curing process may be used, but this is not restrictive.

A cross-section of the edge of the light blocking layer 11 in a direction that is perpendicular to the flat surface of the substrate 110 may be inclined and may have a curved line shape. That is, a side surface of the light blocking layer 11 may be inclined with respect to the flat surface of the substrate 110. A gel-type light blocking material is coated on the substrate 110 and then cured such that the light blocking layer 11 is formed, and an edge of the coated light blocking material may be cured to be inclined with respect to the substrate 110 during the curing process.

The light blocking material that forms the light blocking layer 11 may be any material that can form the light blocking material 11 through the above-stated process while absorbing external light, and for example, the light blocking material may include carbon black, which is a black pigment that contains carbon.

The carbon black may be included with a content of about 3 wt % to 10 wt % with respect to the total content of the light blocking material. When the content of the carbon black is less than about 3 wt %, transmittance of the external light that passes through the display panel 10 and the light blocking layer 11 exceed 20%, and thus the inside can be seen and the external light cannot be absorbed or blocked effectively, and when the content of the carbon black is about 10 wt %, transmittance of the external light almost reaches zero so that about 99% of the external light can be blocked, thereby providing a sufficient external light blocking effect.

The light blocking material may further include a hardener, a resin, and additives other than the carbon black depending on a process condition.

In addition, an average diameter of the carbon black particles may be about 320 nm to about 470 nm. When the average diameter of the carbon black particles is less than 320 nm, the carbon black particles are agglomerated with each other because they are too small to be mixed with other materials (e.g., a hardener, a resin, and the like), and when the average diameter of the carbon black particles exceeds 470 nm, a space between the carbon black particles is increased, thereby deteriorating the light blocking effect.

In addition, transmittance of the external light that passes through the display panel 10 when no voltage is applied and the light blocking layer 11 may be less than about 20% with reference to incident external light. The light blocking layer 11 having such a transmittance range can sufficiently absorb and block external light, and accordingly, the inside of the display panel 10 can be prevented from being seen. That is, when the external light transmittance exceeds 20%, external light cannot be effectively absorbed or blocked, and the inside of the display panel 10 cannot be prevented from being seen within such a range.

The display device according to the present exemplary embodiment further includes a cover panel 30 that overlaps the display panel 10 while facing the same. The light blocking layer 11 is disposed between the cover panel 30 and the display panel 10.

The cover panel 30 according to the present exemplary embodiment may include an impact buffer layer 31, an adhesive layer 33, an auxiliary light blocking layer 35, a support layer 37, and an Embo-type adhesive layer 39. In FIG. 6, the impact buffer layer 31, the adhesive layer 33, the auxiliary light blocking layer 35, the support layer 37, and the Embo-type adhesive layer 39 respectively have steps in the peripheral area PA, but this is not restrictive. One of the layers may have a thick thickness such that other layers may partially not have substantial steps in another exemplary embodiment.

The impact buffer layer 31 may wholly overlap the substrate 110 to protect the entire display panel 10. The impact buffer layer 31 can be made of any material for absorbing an external force and the like, and for example, the material may be a sponge having low elasticity.

The adhesive layer 33 is disposed between the impact buffer layer 31 and the auxiliary light blocking layer 35, and attaches the impact buffer layer 31 to the auxiliary light blocking layer 35.

The auxiliary light blocking layer 35 is provided between the display panel 10 and the adhesive layer 33, and may additionally absorb external light which is not completely absorbed in the light blocking layer 11. Since the auxiliary light blocking layer 35 is provided, see-through to the inside of the display panel 10 due to reflection of the external light can be reduced.

The support layer 37 and the Embo-type adhesive layer 39 may be provided between the auxiliary light blocking layer 35 and the display panel 10.

The support layer 37 may help support the auxiliary light blocking layer 35 and the Embo-type adhesive layer 39 bonded to the impact buffer layer 31, and for example, may be made of polyethylene terephthalate (PET).

The Embo-type adhesive layer 39 attaches the cover panel 30 to the display panel 10. The Embo-type adhesive layer 39 is made of an Embo-type adhesive material, and causes the cover panel 30 to be bonded to the light blocking layer 11 and the display panel 10 without being lifted.

The Embo-type adhesive layer 39 may be provided over the entire display panel 10 or may be partially provided on the display panel 10, and there is no restriction in shape and location. Referring to FIG. 6, the Embo-type adhesive layer 39 according to the present exemplary embodiment may be provided on the entire display panel 10, and may directly contact the substrate 110 in a portion of the peripheral area PA of the substrate 110 which does not overlaps the light blocking layer 11.

The cover panel 30 may further include an auxiliary blocking layer, a support layer, and an Embo-type adhesive layer, but this is not restrictive. The cover panel 30 may include at least one of the auxiliary blocking layer, the support layer, and the Embo-type adhesive layer.

Hereinafter, one of the plurality of pixels included in the display portion 120 will be described with reference to FIG. 7 and FIG. 8. FIG. 7 shows a circuit diagram of a pixel according to an exemplary embodiment of the present inventive concept, and FIG. 8 shows a cross-sectional structure of the pixel, a substrate 110, and an encapsulation substrate 190.

Figure 7:
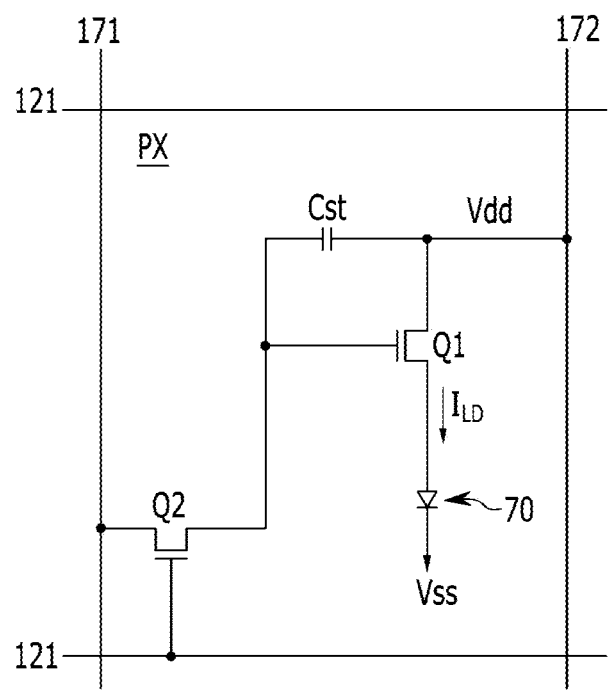
FIG. 7 shows one pixel circuit according to an exemplary embodiment of the present inventive concept.

First, referring to FIG. 7, a display device according to the present exemplary embodiment may be an organic light emitting diode (OLED) display, and includes a plurality of signal lines 121, 171 and 172, and a plurality of pixels PX connected with the signal lines 121, 171 and 172, and arranged in a matrix format. The signal lines include a first signal line 121 transmitting a gate signal, a second signal line 171 transmitting a data signal, and a third signal line 172 transmitting a driving voltage Vdd.

Each pixel PX includes a switching thin film transistor Q2, a driving thin film transistor Q1, a storage capacitor Cst, and an organic light emitting diode (OLED) 70.

The switching thin film transistor Q2 includes a control terminal, an input terminal, and an output terminal, and the control terminal is connected to the first signal line 121, the input terminal is connected with the second signal line 171, and the output terminal is connected with a control terminal of the driving thin film transistor Q1.

The driving thin film transistor Q1 also includes the control terminal, an input terminal, and an output terminal, and the control terminal is connected with the switching thin film transistor Q2, the input terminal is connected with the third signal line 172, and the output terminal is connected with the organic light emitting diode 70. Through the driving thin film transistor Q1, output current ILD flows. The amount of the output current ILD varies according to a voltage applied between the control terminal and the input terminal.

The storage capacitor Cst is connected between the control terminal and the input terminal of the driving thin film transistor Q1. The storage capacitor Cst charges a data signal applied to the control terminal of the driving thin film transistor Q1, and maintains the charge of the data signal after the switching thin film transistor Q2 is turned off.

The organic light emitting diode 70 includes an anode connected with the output terminal of the driving thin film transistor Q1 and a cathode connected with a common voltage Vss. The organic light emitting diode 70 displays an image by emitting light, the strength of which varies depending on a current of the driving thin film transistor Q1.

Figure 8:
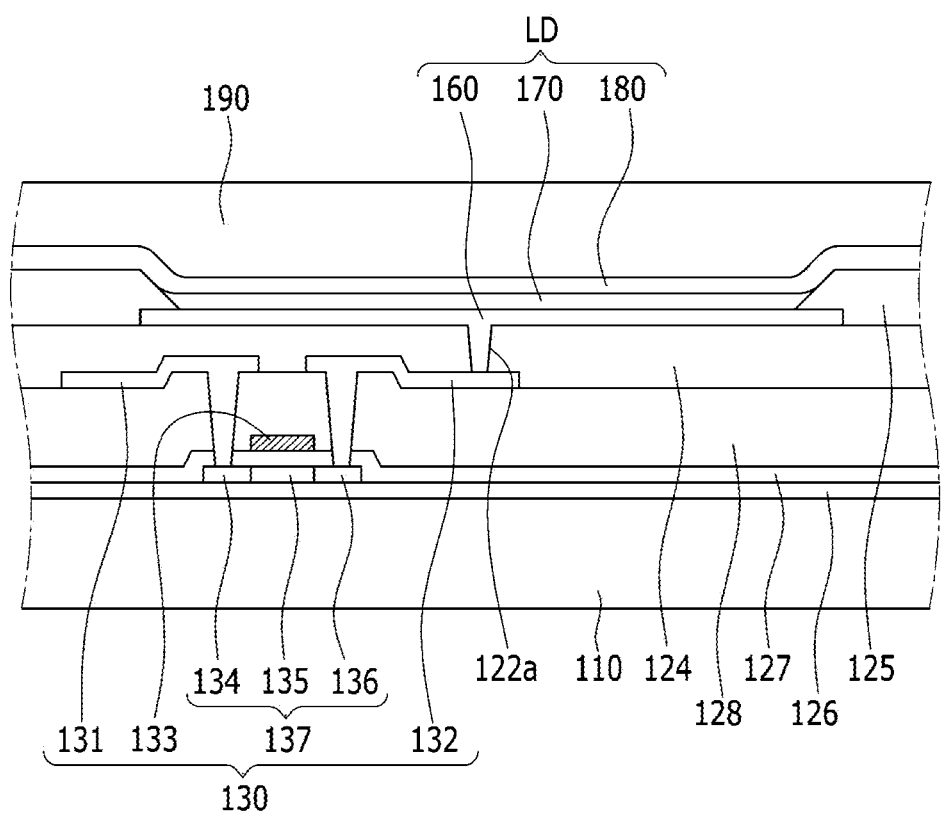
FIG. 8 shows a cross-sectional structure of the pixel.

Referring to FIG. 8, the OLED display according to the present exemplary embodiment includes a substrate 110, a thin film transistor 130, a first electrode 160, an organic emission layer 170, a second electrode 180 and an encapsulation substrate 190.

The substrate 110 may be an insulation substrate made of glass, quartz, ceramic, plastic, and the like, or a flexible substrate. In addition, a buffer layer 126 may be provided on the substrate 110. The substrate buffer layer 126 serves to prevent permeation of an impurity element and planarize the surface of the substrate 110.

A driving semiconductor layer 137 is provided on the substrate buffer layer 126. The driving semiconductor layer 137 includes a channel region 135 which is not doped with an impurity, a source region 134, and a drain region 136. The source region 134 and the drain region 136 are disposed at opposite sides of the channel region 135 and doped with an impurity.

A gate insulating layer 127 is provided on the driving semiconductor layer 137, and a gate wire that includes a driving gate electrode 133 is disposed on the gate insulating layer 127.

Meanwhile, an interlayer insulating layer 128 that covers the driving gate electrode 133 is provided on the gate insulating layer 127. The gate insulating layer 127 and the interlayer insulating layer 128 include contact holes that respectively expose the source region 134 and the drain region 136 of the driving semiconductor layer 137.

In addition, a data wire that includes a driving source electrode 131 and a driving drain electrode 132 is provided on the interlayer insulating layer 128. The driving source electrode 131 and the driving drain electrode 132 are respectively connected with the source region 134 and the drain region 136 of the driving semiconductor layer 137.

The driving semiconductor layer 137, the driving gate electrode 133, the driving source electrode 131, and the driving drain electrode 132 form a driving thin film transistor 130. The configuration of the driving thin film transistor 130 is not limited to the above-stated configuration, and may be variously changed to known configurations.

Next, a planarization layer 124 that covers the data wire is provided on the interlayer insulating layer 128. The planarization layer 124 includes a contact hole 122a that partially exposes the drain electrode 132. The present exemplary embodiment is not limited to the above-stated structure, and one of the planarization layer 124 and the interlayer insulating layer 128 may be omitted as necessary.

Next, an anode, which is the first electrode 160, is provided on the planarization layer 124. The first electrode 160 is connected with the drain electrode 132 through the contact hole 122a of the planarization layer 124, and may be made of a reflective conductive material.

In addition, a pixel defining layer 125 having an opening that exposes the first electrode 160 is provided on the planarization layer 124. The organic emission layer 170 may be provided in the opening of the pixel defining layer 125.

The second electrode 180, that is, an anode, may be provided on the organic emission layer 170. In this case, the second electrode 180 may be made of a transparent conductive material. Accordingly, an organic light emitting element LD that includes the first electrode 160, the organic emission layer 170, and the second electrode 180 is formed, and the organic light emitting element LD may be a front emission type.

An encapsulation substrate 190 that covers the second electrode 180 for protection may be provided on the second electrode 180. The encapsulation substrate 190 seals the organic light emitting diode and a driving circuit portion provided on the substrate 110 from an external environment for protection, and may be made of a transparent material.

The circuit diagram shown in FIG. 7 and the cross-sectional structure of the pixel shown in FIG. 8 are exemplarily illustrated, and can be variously modified.

In addition, after manufacturing the display panel, a light blocking layer may be formed on one side of the substrate 110 or a thin film transistor and the like may be formed after forming the light blocking layer on one side of the substrate 110. That is, a manufacturing sequence of the light blocking layer and the display panel can be variously modified.

Hereinafter, visibility of the inside of a display device according to exemplary embodiments and comparative examples will be described with reference to FIG. 9 to FIG. 16.

Figure 9:
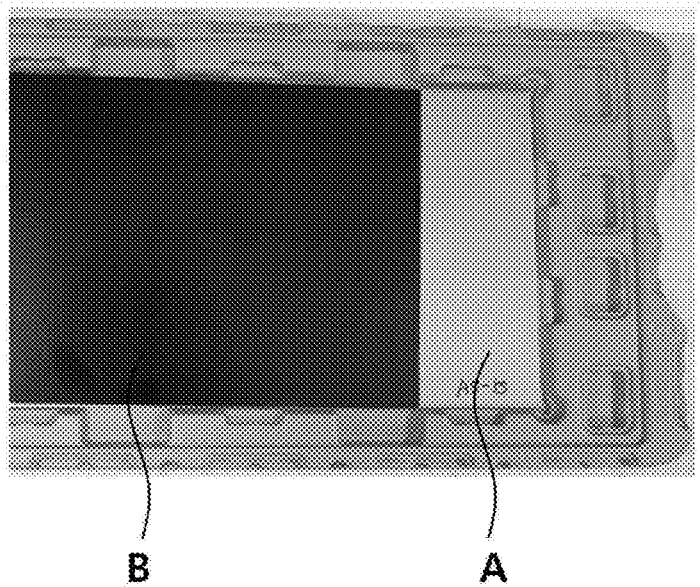
FIG. 9, FIG. 10, FIG. 11, and FIG. 12 respectively show comparison images of the inside of the display panels according to Exemplary Embodiment 1 (B), Exemplary Embodiment 2 (C), Comparative Example 1 (D), and Comparative Example 2 (E), with Comparative Example 3 (A)
Figure 10:
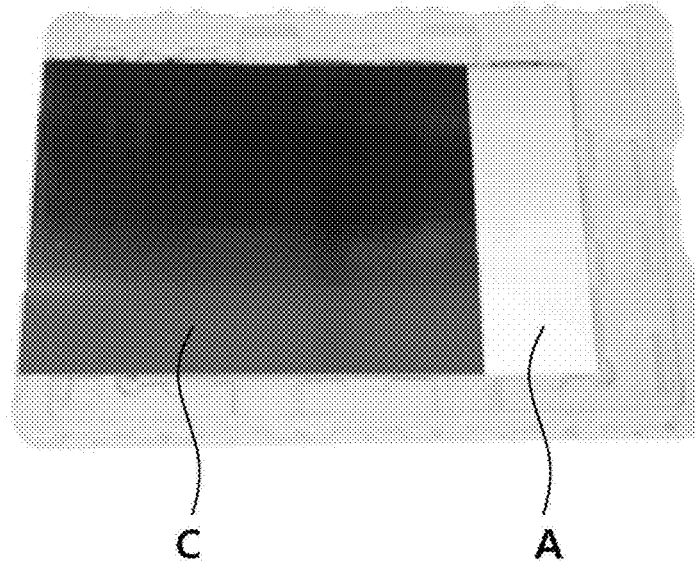
Figure 11:
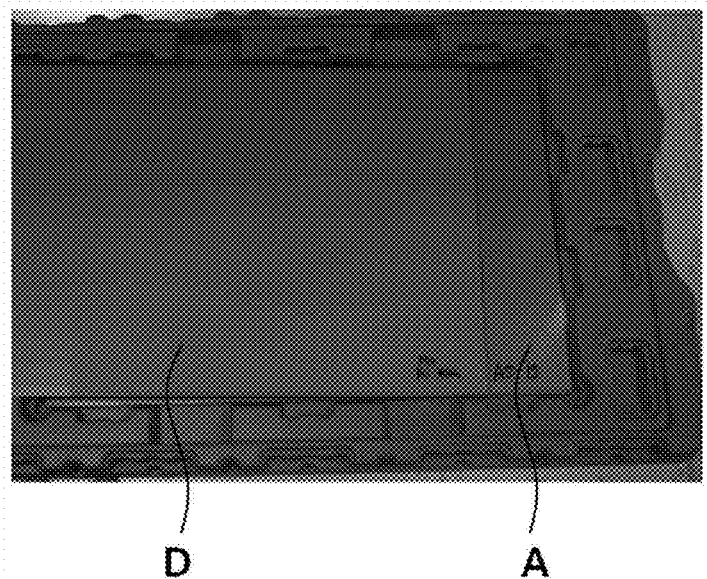
Figure 12:
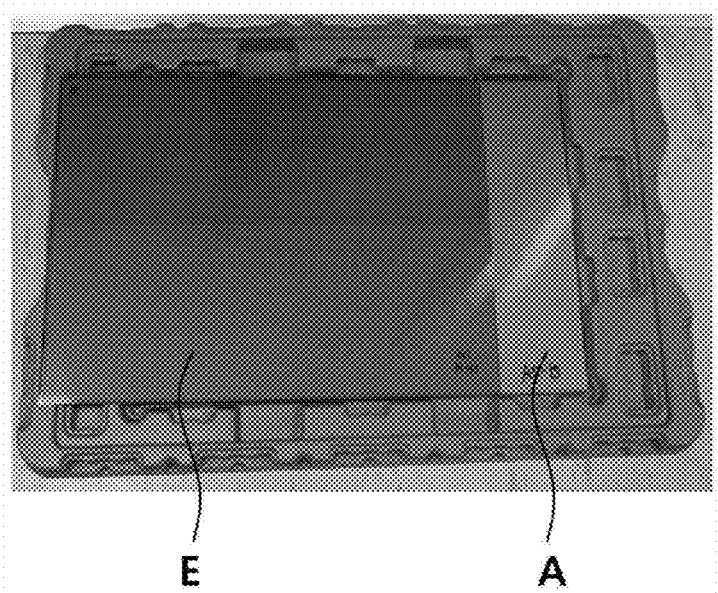

First, FIG. 9 shows a comparison between an image of an inside of a display panel according to Exemplary Embodiment 1 (B) and an image of the inside of a display panel according to Comparative Example 3 (A), FIG. 10 shows a comparison of an image of the inside of a display panel according to Exemplary Embodiment 2 (C) and an image of the inside of a display panel according to Comparative Example 3 (A), FIG. 11 shows a comparison between an image of the inside of a display panel according to Comparative Example 1 (D) and an image of an inside of a display panel according to Comparative Example 3 (A), and FIG. 12 shows a comparison between an image of the inside of a display panel according to Comparative Example 2 (E) and an image of the inside of a display panel according to Comparative Example 3 (A).

Figure 13:
FIG. 13 shows whether or not the inside of the display panel according to Exemplary Embodiment 1 is seen, and FIG. 14, FIG. 15, and FIG. 16 respectively show whether or not the inside of the display panels according to Comparative Examples 1 to 3 are seen.
Figure 14:
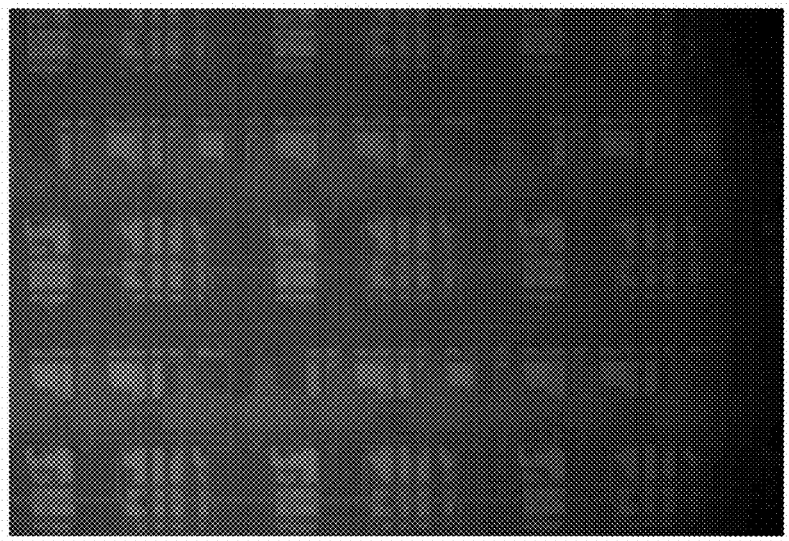
Figure 15:
Figure 16:

FIG. 13 is an image for observing whether or not the inside according to Exemplary Embodiment 1 is seen, FIG. 14 is an image for observing whether or not the inside according to Comparative Example 1 is seen, FIG. 15 is an image for observing whether or not the inside according to Comparative Example 2 is seen, and FIG. 16 is an image for observing whether or not the inside according to Comparative Example 3 is seen. Although an image that shows whether or not the inside according to Exemplary Embodiment 2 is seen is not additionally included in the drawings, it was determined that the result is substantially the same as that of FIG. 13.

In this case, except for features of Exemplary Embodiment 1, Exemplary Embodiment 2, Comparative Example 1, Comparative Example 2, and Comparative Example 3 shown in Table 1, structures and manufacturing processes are the same.

TABLE 1

| | |
|---|---|
| Exemplary Embodiment 1 | A light blocking layer is disposed inside of the display panel. A content of carbon black in a light blocking material that forms the light blocking layer is 6 wt %. |
| Exemplary Embodiment 2 | A light blocking layer is disposed inside of the display panel. A content of carbon black in a light blocking material that forms the light blocking layer is 3 wt %. |
| Comparative Example 1 | A polyimide layer is disposed inside of the display panel. In a manufacturing process, coating speed of a polyimide material is fast. |
| Comparative Example 2 | A polyimide layer is disposed inside of the display panel. A very small amount of carbon black (less than 3%) is included in the polyimide material. In a manufacturing process, coating speed of a polyimide material is fast. |
| Comparative Example 3 | A polyimide layer is disposed inside of the display. Coating speed of the polyimide material is slow compared to Comparative Examples 1 and 2. |

Referring to Table 1, in Exemplary Embodiment 1, the light blocking layer is disposed inside of the display panel, a light blocking material that forms the light blocking layer includes carbon black with a content of 6 wt % with respect to the total content of the light blocking material, and a silkscreen process and a thermal-curing process are performed on the inside of the display panel using the light blocking material such that the light blocking layer is formed.

In Exemplary Embodiment 2, the light blocking layer is provided inside of the display panel, a content of the light blocking material is 3 wt % with respect to the total content of the light blocking material, and a silkscreen process and a thermal-curing process are performed on the inside of the display panel using the light blocking material such that the light blocking layer is formed.

A polyimide layer is provided inside of the display panel, and the polyimide layer is formed by coating and curing a polyimide material with a predetermined speed in Comparative Example 1, a polyimide layer is formed by mixing carbon black with a content of less than 3 wt % with the polyimide material under the same manufacturing process of Comparative Example 1 in Comparative Example 2, and a polyimide layer is provided inside of the display panel and a polyimide material that forms the polyimide layer is coated and cured with a speed that is slower than the speed compared to Comparative Examples 1 and 2 in Comparative Example 3.

A cover panel provided as a film and the like cannot be completely attached to the inside of the display panel without generating lift therebetween. Thus, when the cover panel including the light blocking layer is attached to the display panel, lift is generated between the cover panel and the display panel so that the cover panel cannot block external light. That is, Comparative Examples 1 to 3 are display devices, each including the display panel and the polyimide layer provided inside of the display panel, and show a similar result to that of the display device that includes a cover panel that includes a light blocking layer. Thus, in the present specification, although an image according to a comparative example in which a cover panel is provided at the inside of a display panel and the cover panel includes a light blocking layer is not included in the drawings, the image can be analogized from Comparative Examples 1 to 3.

FIG. 9 and FIG. 10 show comparisons between Exemplary Embodiment 1 (B) and Exemplary Embodiment 2 (C) with Comparative Example 3 (A). The insides of the display panels according to Exemplary Embodiment 1 (B) and Exemplary Embodiment 2 (C) include black light blocking layers that cannot transmit light, however, the inside of the display panel of Comparative Example 3 (A) is close to white such that it transmits external light. Accordingly, when the light blocking layer according to the exemplary embodiments of the present inventive concept is included, external light can be effectively blocked. That is, when the light blocking material includes carbon black of at least 3 wt %, external light can be substantially blocked.

Meanwhile, the comparison between Comparative Example 1 (D) and Comparative Example 3 (A) and the comparison between Comparative Example 2 (E) and Comparative Example 3 (A) respectively show that there is little difference in light blocking of the inside of the display panel according to Comparative Examples 1 to 3 as shown in FIG. 11 and FIG. 12. That is, external light cannot be easily absorbed by simply including a polyimide layer including 3 wt % of less of carbon black, or partially changing a process condition.

Further, when external light is transmitted to the display panel and the light blocking layer according to Exemplary Embodiment 1, transmittance of external light was about 4%, while when external light is transmitted to the display panel and the light blocking layer according to Exemplary Embodiment 2, transmittance of external light was about 16%, and the results were observed as almost black as shown in FIG. 13. Thus, when a display device having external light transmittance of less than about 20% is provided by aggregating the exemplary embodiments, the inside of a display panel can be prevented from being seen while improving display quality.

However, Comparative Example 1 and Comparative Example 2 showed that external light transmittance was about 50% and a plurality of pixels were seen as shown in FIG. 14 and FIG. 15, and Comparative Example 3 showed that external light transmittance was about 67% and a plurality of pixels were clearly seen as shown in FIG. 16. Comparative Examples 1 to 3 do not include cover panels, but comparative examples that include cover panels are expected to show similar results, as previously stated.

That is, when a display device that includes a light blocking layer that contacts the inside of a display panel according to the exemplary embodiment of the present inventive concept is used, about 40% to 60% of external light can be blocked and absorbed compared to Comparative Example 3 in which external light transmittance is about 67%, and accordingly, visibility of the inside of the display panel can be reduced.

In summary, in a display device including an organic light emitting element, when a thin and high-transmissive material is used as constituent elements included in a display panel, and thus external light is reflected from the inside of the display panel, the inside is seen. That is, contrast is deteriorated and display quality is deteriorated due to reflection of external light.

However, the display device according to the exemplary embodiment of the present inventive concept includes the light blocking layer that is provided inside of the display panel, and the light blocking layer absorbs most of the external light, and accordingly, performance degradation of the display device due to reflection of external light can be prevented. Further, as the cover panel becomes thin, the thickness and the weight of the display device can be reduced.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
    a substrate;
    a thin film transistor provided on a first side of the substrate;
    a first electrode connected with the thin film transistor;
    an organic emission layer provided on the first electrode and emitting light;
    a second electrode provided on the organic emission layer; and
    a light blocking layer contacting the substrate from a second side that faces the first side of the substrate,
    wherein the light is emitted in a direction toward the second electrode from the organic emission layer,
    wherein the substrate comprises:
        a display area where a plurality of pixels are disposed; and
        a peripheral area that surrounds the display area, and
    wherein the light blocking layer overlaps the entire display area and partially overlaps the peripheral area, while not overlapping an edge of the peripheral area.

2. The display device of claim 1, wherein the light blocking layer comprises carbon black.

3. The display device of claim 2, wherein the carbon black is included with a content of about 3 wt % to about 10 wt % with respect to the total content of a material that forms the light blocking layer.

4. The display device of claim 2, wherein an average diameter of carbon black particles is about 320 nm to about 470 nm.

5. The display device of claim 1, wherein the first electrode is made of a reflective material and the second electrode is made of a transparent material.

6. The display device of claim 1, wherein a cross-section of the edge of the light blocking layer has a curved line shape.

7. The display device of claim 1, further comprising a cover panel that overlaps the substrate,
    wherein the light blocking layer is provided between the cover panel and the substrate.

8. The display device of claim 7, wherein the cover panel comprises:
    an impact buffer layer that overlaps the light blocking layer; and
    an adhesive layer provided between the impact buffer layer and the light blocking layer.

9. The display device of claim 8, wherein the adhesive layer overlaps the substrate, and contacts at least one of the light blocking layer and the substrate.

10. The display device of claim 9, wherein the adhesive layer directly contacts a part of the substrate.

11. The display device of claim 8, wherein the cover panel further comprises at least one of an auxiliary layer, a support layer, and an Embo-type adhesive layer, which are provided between the adhesive layer and the light blocking layer.

12. The display device of claim 1, further comprising an encapsulation substrate that is provided on the second electrode and is made of a transparent material.

13. The display device of claim 1, wherein the display device is flexible.

* * * * *